United States Patent [19]

Abraham

[11] Patent Number: 4,695,923
[45] Date of Patent: Sep. 22, 1987

[54] PRINTED CIRCUIT BOARD BOLT-ON POWER DISTRIBUTION SYSTEM

[75] Inventor: Ronald F. Abraham, Phoenix, Ariz.

[73] Assignee: Honeywell Information Systems Inc., Phoenix, Ariz.

[21] Appl. No.: 901,235

[22] Filed: Aug. 28, 1986

[51] Int. Cl.$^4$ ............................................. H02B 1/20
[52] U.S. Cl. .................... 361/361; 361/376; 361/417
[58] Field of Search ............... 361/361, 362, 376, 417, 361/419, 427, 385

[56] References Cited

U.S. PATENT DOCUMENTS

| | | | |
|---|---|---|---|
| 3,851,130 | 11/1974 | Paulson | 361/385 |
| 4,288,656 | 9/1981 | Olashaw | 361/361 |
| 4,414,605 | 11/1983 | Chino et al. | 361/385 |

Primary Examiner—Robert S. Macon
Attorney, Agent, or Firm—A. A. Sapelli; J. S. Solakian

[57] ABSTRACT

A bolt-on configuration of a power distribution system utilizes an apparatus which connects a first element to a second element, the second element having a hole, such that a minimum predetermined force exists at the connection between the first element and the second element. The apparatus comprises a shaft, having a first, second, and third diameter along the axis of the shaft, thereby forming a first, second, and third shaft, respectively, the first diameter being the smallest diameter and the third diameter being the largest diameter. The first shaft is threaded, for mating with the second element. A spring, having an inside diameter smaller than the diameter of the third shaft and having a length approximately equal to the length of the first and second shaft is coaxially positioned over the first and second shaft. When the first element is placed in contact with the second element, there is applied a minimum predetermined force between the first and second element by the action of the spring when the first shaft is inserted into the hole of the second element to the point where the base of the second shaft contacts the surface of the first element.

4 Claims, 12 Drawing Figures

PRINTED CIRCUIT BOARD BOLT-ON POWER DISTRIBUTION SYSTEM

BACKGROUND OF THE INVENTION

This invention relates to a power distribution system of printed circuit boards of electronic systems, and more particularly, to a power distribution system incorporating a bolt-on arrangement of a printed circuit board.

In present day electronic systems, including data processing systems, circuits which make up the systems and subsystems of the electronic system utilize integrated circuit chips mounted on a printed wire board. Connectors are utilized to couple the various control and data signals to and from one printed wire board to another. In addition, the electrical power requirements for the integrated circuits are likewise coupled to the printed wire board via the connector. Some configurations dedicate a fixed pin (or pins) or position of each connector for the power (and ground) supply voltage(s), also referred to herein as the power signal(s). In many present day systems, the power signal is coupled to the printed wire board via a connector. The connector is of a bayonet-type in which pads of the printed wire board are inserted into predetermined positions of the connector. The force exerted by the connector contact on the pad of the printed wire board is in the order of milligrams. This force is generally sufficient to establish an electrical connection with little voltage drop across the contact when there is a low current flow. However, if the current flow is sufficiently high, there can exist a high voltage drop across the contact of the connector and the pad of the printed wire board resulting in a loss of voltage level to the integrated circuit on the printed wire board. Similarly, the ground level on the printed wire board can be at some voltage level other than zero potential if there is a sufficiently high resistance in the ground contact point.

Therefore, there exists a need to have a power distribution system which can provide low resistance contacts for printed wire boards having high current requirements. The present invention utilizes a bolt-on design which allows for visually verifying good electrical connection. The present invention also utilizes a bus strip system and bus bars for distributing power that minimizes the use of connectors. A housing design is also included which incorporates power connectors, printed wire board jack screws, identification labels, printed wire board stiffeners, air blocks, and insulates the power bars protecting an operator working on the equipment, and thereby meeting the UL and CSA standards.

SUMMARY OF THE INVENTION

Therefore, there is provided by the present invention a novel power distribution system incorporating a bolt-on configuration. The bolt-on configuration includes an apparatus which connects a first element to a second element, the second element having a hole, such that a minimum predetermined force exists at the connection between the first element and the second element. The apparatus comprises a shaft, having a first, second, and third diameter along the axis of the shaft, thereby forming a first, second, and third shaft, respectively, the first diameter being the smallest diameter and the third diameter being the largest diameter. The first shaft is threaded, for mating with the second element. A spring, having an inside diameter smaller than the diameter of the third shaft and having a length approximately equal to the length of the first and second shaft, is coaxially positioned over the first and second shaft. When the first element is placed in contact with the second element, there is applied a minimum predetermined force between the first and second element by the action of the spring when the first shaft is inserted into the hole of the second element tot he point where the base of the second shaft contacts the surface of the first element.

Accordingly, it is an object of the present invention to provide a novel power distribution system.

It is another object of the present invention to provide a novel bolt-on power distribution system.

It is still another object of the present invention to provide a novel bolt-on power distribution system for distributing power to printed wire boards.

These and other objects of the present invention will become more apparent when taken in conjunction with the following description and attached drawings, wherein like characters indicate like parts, and which drawings form a part of the present application.

DETAILED DESCRIPTION

Figure 1:
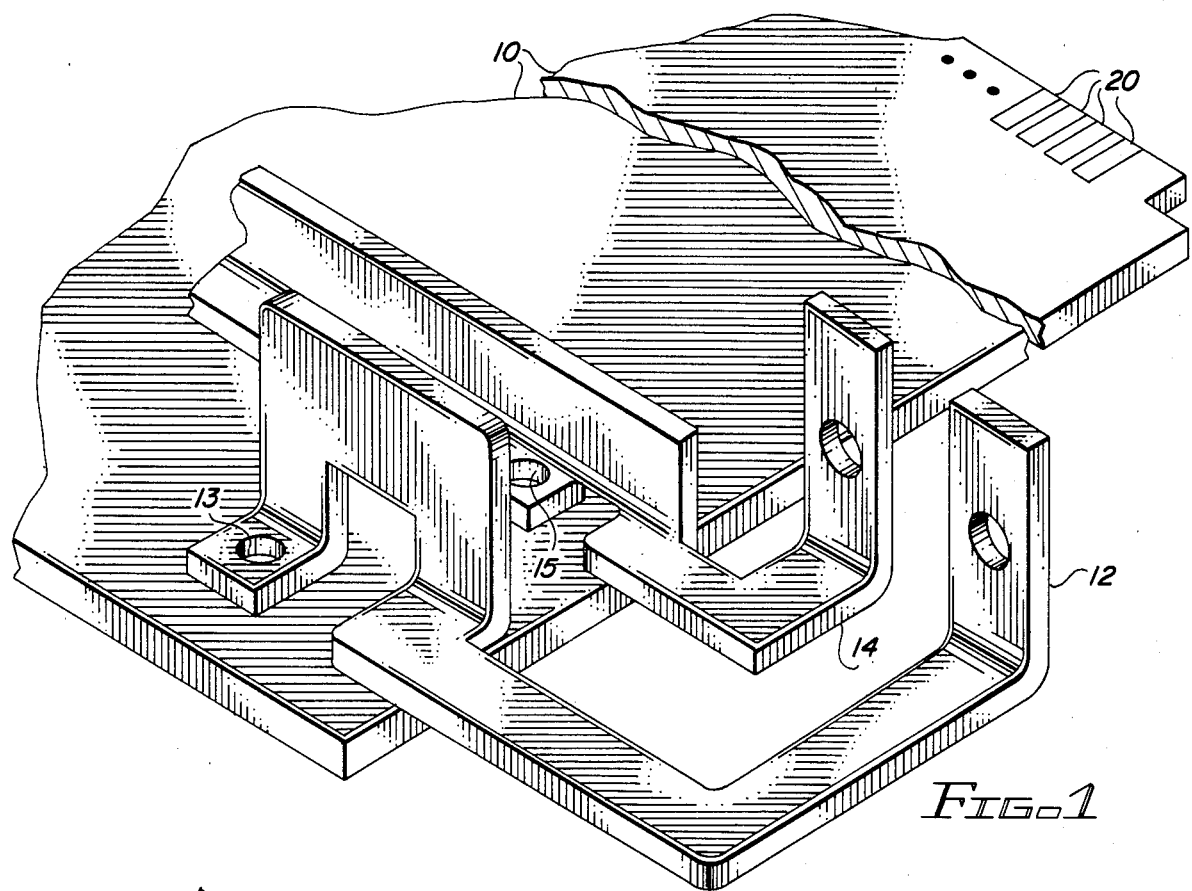
FIG. 1 shows a pictorial view of the printed wire board (PWB) having bus strips.

Referring to FIG. 1, there is shown a pictorial view of the printed wire board having bus strips. A printed wire board (PWB) 10 has mounted thereon bus strips 12, 14, the bus strips 12, 14 being fastened to the PWB 10 by a fastener (not shown) utilizing hole 13, 15, respectively. A pad (not shown), i.e., a metallic layer, can exist on either or both sides of the PWB around the hole corresponding to hole 13, 15. From the pad the electrical power signal is coupled to other points of the PWB (e.g. to integrated circuit chips [IC] mounted on the PWB, not shown). The bus strip 12 is mounted at one side of the PWB 10, and the bus strip 14 is mounted on both sides of the PWB 10, extending from one end of the PWB along the front edge to the other side (not shown). In the latter case the bus strip 14 is bolted to a bus bar (as will be described later) at both sides of the PWB 10. PWB 10 has pads 20 at the back edge which mate with connectors of a back plane (not shown). It will be understood by those skilled in the art that the printed wire board 10 can be a single layered or multi-layered printed wire board.

Figure 2:
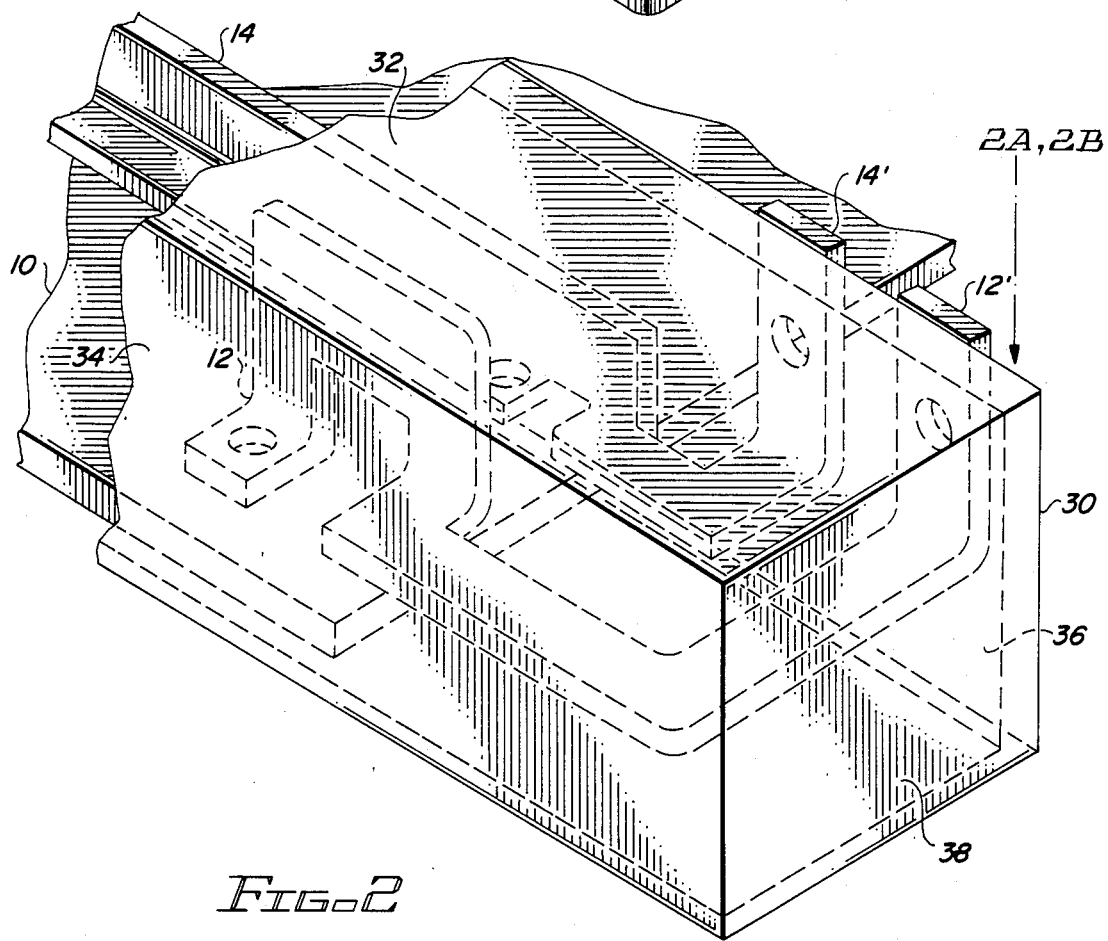
FIG. 2 shows the pictorial view of the PWB of FIG. 1 including a housing.

Referring to FIG. 2, there is shown the PWB 10 of FIG. 1 including a housing 30. The housing is basically hollow having a top surface 32, front and back surfaces 34, 36, and a side surface 38. (The other side surface is not shown.) The housing 30 does not have a bottom surface but basically utilizes the PWB 10 as a bottom surface when the housing 30 is mounted on the PWB 10. The housing covers (i.e., insulates) the bus strips 12, 14, except for the vertical ends 12', 14', which are used to mount to a respective bus bar (not shown), which will be described hereinunder.

Figure 2A:
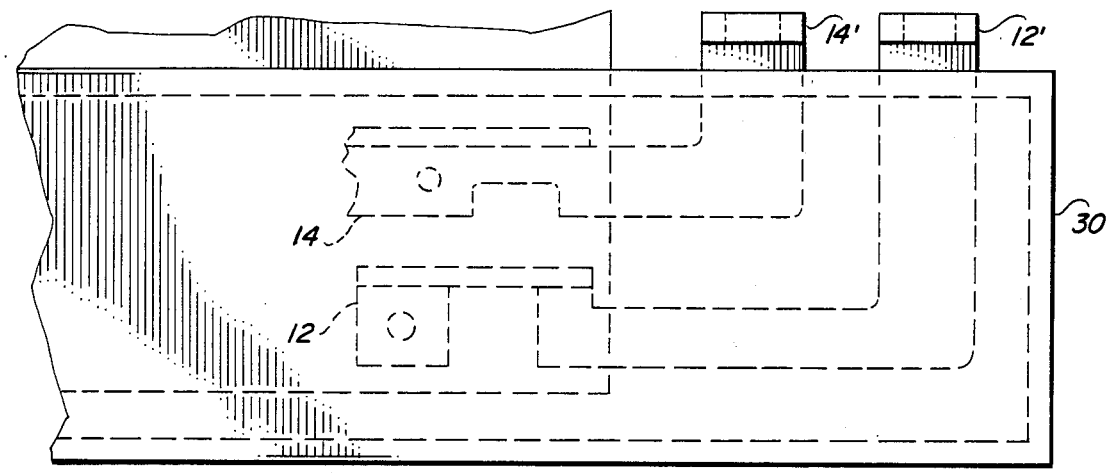
FIG. 2A shows a top view of FIG. 2.

FIG. 2A shows a top view of FIG. 2 including the housing 30 and the extension of the vertical ends 12', 14', of bus strips 12, 14.

Figure 2B:
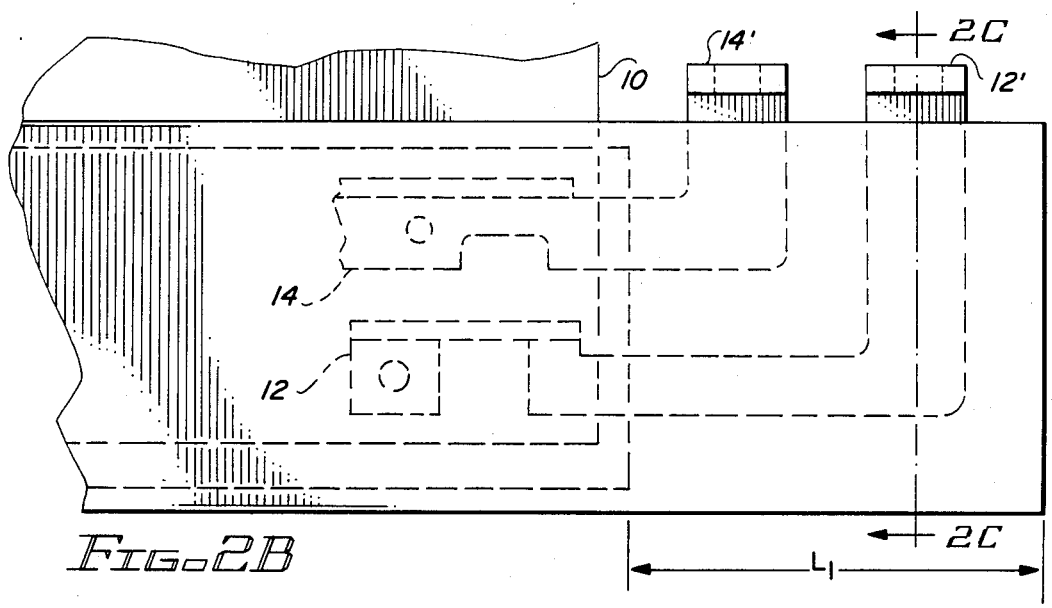
FIG. 2B shows a top view of FIG. 2 modified to show the essentially solid portion of the housing which extends beyond the PWB, the essentially solid portion forming the casing for at least one bolt-on connector of the present invention.

FIG. 2B also shows a top view of FIG. 2 including the vertical ends 12', 14' of bus bars 12, 14 exposed from the housing 30. However, a portion of the housing 30 which extends from the PWB 10, the partial length $L_1$, is shown in FIG. 2B as being essentially solid, for the purposes of holding (or housing) the bolt-on connectors of the present invention.

Figure 2C:
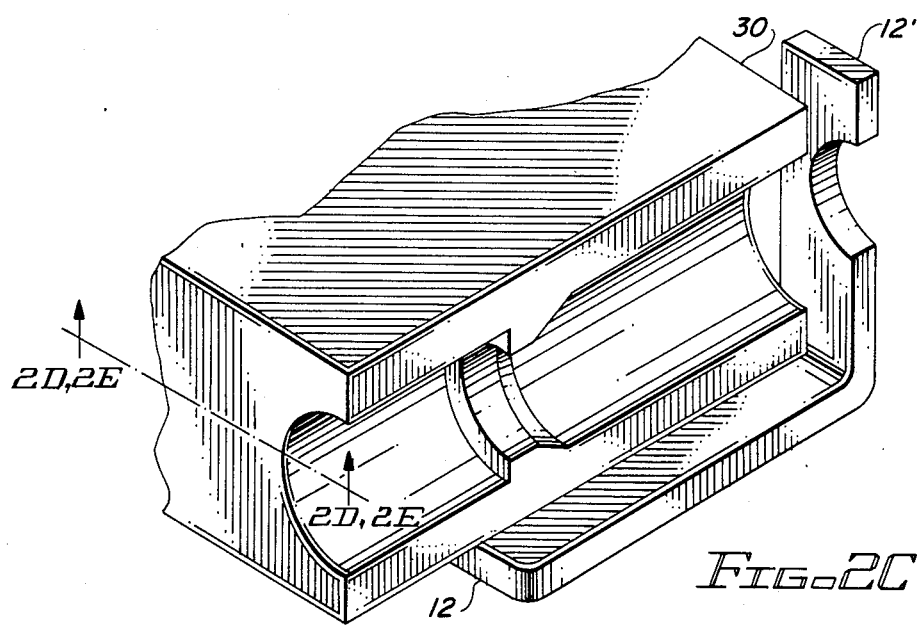
FIG. 2C shows a cut-away section of the essentially solid portion of the housing and includes the configuration for holding the bolt-on connector of the preferred embodiment of the present invention.

FIG. 2C shows a cut-away section of the essentially solid housing end $L_1$ and shows the configuration of the hollow for holding the bolt-on connector of the preferred embodiment of the present invention.

Figure 2D:
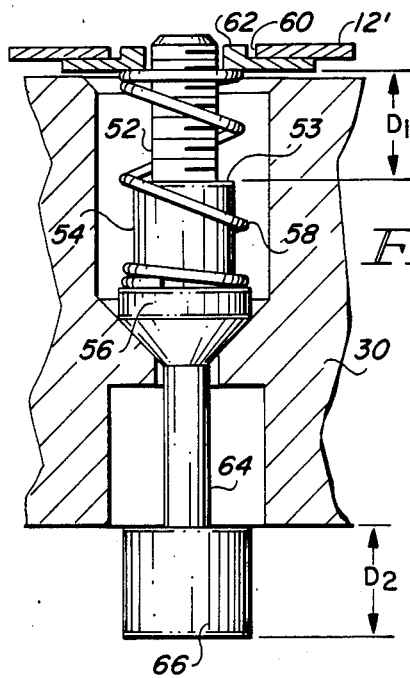
FIG. 2D shows the cut-away section of the essentially solid housing of FIG. 2C including the bolt-on connector of the preferred embodiment of the present invention.

Referring to FIG. 2D, there is shown a cut-away section of the housing 30 extending beyond the PWB 10 showing the bolt-on arrangement of the present invention. In the housing 30, there is included the bolt arrangement or bolt-on connector of the preferred embodiment of the present invention. The bolt arrangement includes a first shaft 52, which is threaded. A second shaft 54, coaxial to the first shaft 52 having a larger diameter than the first shaft, inhibits the insertion of the first shaft 52 at a predetermined point when the first shaft 52 is inserted into a threaded hole. A third shaft 56, coaxial to the first and second shaft and having a larger diameter than the second shaft, keeps a spring 58 in position, the inside diameter of the spring 58 being smaller than the diameter of the third shaft 56. The spring, having a length approximately equal to the length of the first shaft 52 and the second shaft 54, is positioned over the first and second shaft 52, 54. The vertical end of the bus strip 12' includes a hole 60. A washer 62 has a notch such that is is positioned within hole 60 and has a hole larger than the diameter of the first shaft 52 so that the first shaft 52 can be inserted through the hole of the washer 62. The washer 62 is utilized in the preferred embodiment of the present invention because the bus strips 12 are of a relatively soft metal such as copper and the first shaft 52 is made of a stainless steel material, the washer 62 thereby protecting bus strip 12'. The bus strip 12' is mounted to PWB 10 (not shown) and likewise housing 30 is mounted to PWB 10 (not shown), thus fixing the position of the housing 30 with respect to the vertical end 12' of the bus strip 12. In the position as shown in FIG. 2D the spring 58 is only slightly compressed thereby holding the washer 62 and spring 58 in place. In the preferred embodiment of the present invention, there is also included an extender shaft 64 which is coaxially mounted to the third shaft 56, and has a knob 66 made of a dielectric material attached thereto. The height of the knob $D_2$ is equal to the distance from the a base end of the second shaft 54 to the top surface of the washer 62, that distance being denoted as $D_1$. The ring-like surface between the surface of the first shaft 52 and the surface of the second shaft 54 and perpendicular to the axis of the first and second shafts 52, 54 is referred to as the base 53 of the second shaft 54.

Figure 2E:
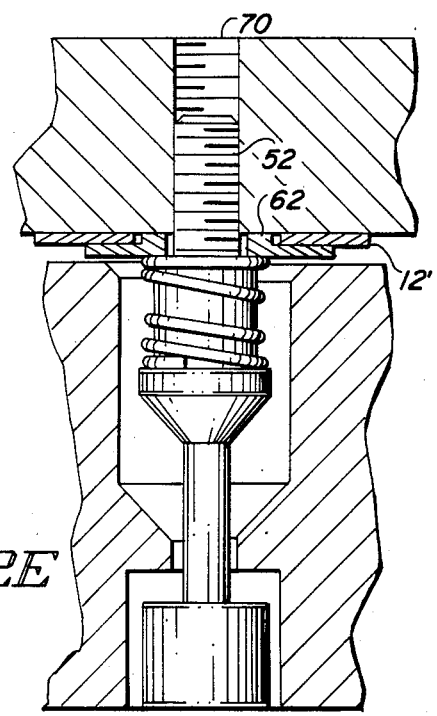
FIG. 2E shows the cut-away section of FIG. 2C with the bolt-on connector mated with a bus bar.

FIG. 2E likewise shows a pictorial cut-away view of FIG. 2C including a bus bar 68, the bolt-on arrangement being shown in the connected configuration. The bus bar 68 extends horizontally in a cabinet of an electronic system which houses the PWBs 10, the bus bar 68 supplying the required voltage to the PWBs 10. The bus bar 68 includes threaded holes 70 positioned to accept the bolt-on connectors of the PWBs 10. In the connected configuration the first shaft 52 is threaded into the corresponding hole 70 of bus bar 68. The first shaft is threaded into the hole 70 until the base of the second shaft 54 contacts the top surface of washer 62. In this position, the spring 58 has been compressed a distance $D_1$ resulting in the spring 58 applying a predetermined force against the washer 62 and the bus bar 68. The predetermined force is determined by the characteristics of the spring 58 and the amount of spring 58 compression which are calculated to insure the minimum desired force of the bus strip 12 against the bus bar 68 sufficient to establish the electrical contact required for the current/voltage requirements of the PWB. In this configuration, the top surface of the knob 66 has traveled a distance $D_2$ which is also equal to $D_1$ as described above. Thus, by a visual inspection by an operator it can be determined that a minimum amount of force, i.e., the predetermined amount of force established by the spring characteristics, is applied against the bus bar 68. In this manner, a sufficiently good electrical contact can be visually verified and can be established without over-torquing the first shaft 52 into the threaded hole 70, and without risking stripping the threads. If further force is required a notch can be included in the knob 66 for using a torque-wrench or torque-screwdriver. However, the minimum force can be verified by visual inspection.

Figure 3A:
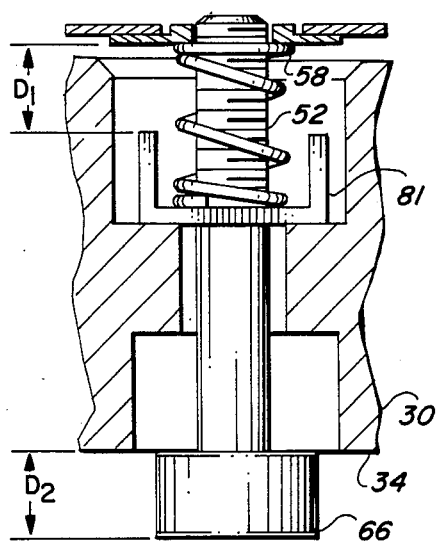
FIG. 3A shows an alternative embodiment of the present invention.

FIG. 3A shows an alternative embodiment of the present invention for applying a predetermined force of the bus strip against the bus bar which includes a hollow cylinder 81 afixed to the shaft 52, the length of the hollow cylinder 81 and the position of the hollow cylinder 81 to the shaft 52 being established so that the distance traveled, i.e., the amount that the spring 58 is compressed is equal to the distance the top surface of the knob 66 has to travel to be flush with the front surface 34 of the housing 30.

Figure 3B:
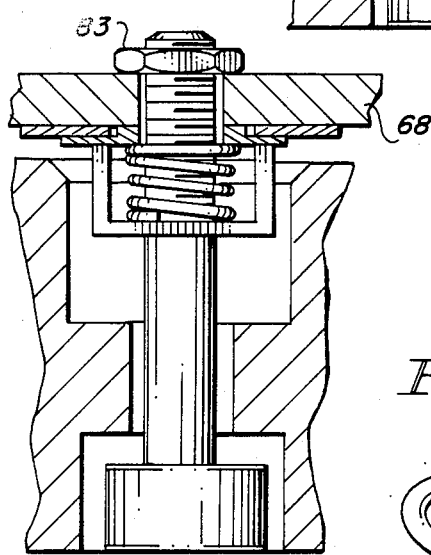
FIG. 3B shows the alternative embodiment of FIG. 3A in a connected configuration.

FIG. 3B shows the alternative embodiment of FIG. 3A in the connected configuration, including the bus bar 68 having a hole for insertion of the first shaft 52. An alternative configuration permits the use of a nut 83 to achieve bolting the bolt-on arrangement (or bolt-on connector) to the bus bar 68, and does not require the use of a threaded hole 70.

Figure 4C:
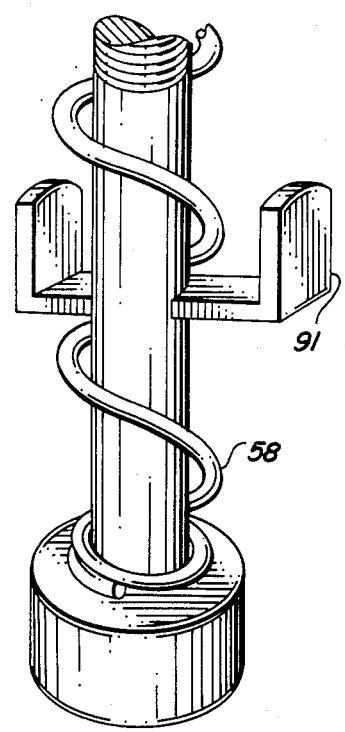
FIG. 4C shows a pictorial view of the alternative embodiment of FIGS. 4A and 4B.
Figure 4A:
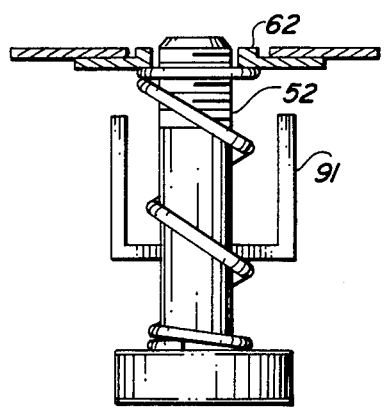
FIG. 4A shows still another alternative embodiment of the present invention.
Figure 4B:
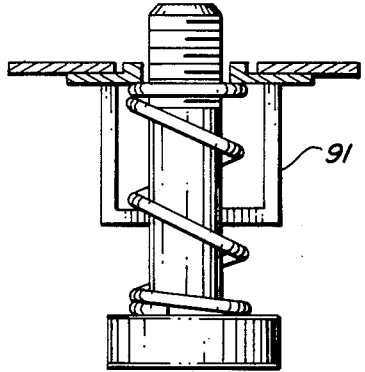
FIG. 4B shows the alternative embodiment of FIG. 4A in a connected configuration.

FIGS. 4A, 4B, and 4C, which together form FIG. 4, likewise show still another alternative embodiment of the present invention including a stopping element 91 affixed to the shaft 52. In FIG. 4 it can be seen that the shaft 52 only needs be threaded a portion sufficient to insure that the stopping element 91 makes contact with the washer 62. Further, for this alternative embodiment it is necessary that the configuration of the spring 58 be such that the stopping element 91 does not conflict or interfere with the action of the spring 58 in either the unconnected or connected configuration as shown in FIGS. 4A and 4B, respectively.

While there has been shown what is considered the preferred embodiment of the present invention, it will be manifest that many changes and modifications can be made therein without departing from the essential spirit and scope of the invention. It is intended, therefore, in the annexed claims to cover all such changes and modifications which fall within the true scope of the invention.

I claim:

1. An apparatus for connecting a first element to a second element, the second element having a hole, such that a minimum predetermined force exists at the connection between said first element and said second element, said apparatus comprising:
   (a) shaft means, having a first, second, and third diameter along the axis of said shaft means, forming a first, second, and third shaft, respectively, said first diameter being the smallest diameter and said third diameter being the largest diameter, said first shaft being threaded, for mating with said second element; and
   (b) spring means, having an inside diameter smaller than the diameter of said third shaft and having a length approximately equal to the length of the first and second shaft, coaxially positioned over said first and second shaft, and when said first element is placed in contact with said second element, for applying a minimum predetermined force between said first and second element when said first shaft is inserted into the hole of said second element to the point where the base of said second shaft contacts the surface of said first element.

2. An apparatus for connecting a first element to a second element having a hole such that a minimum predetermined force exists at the connection between said first element and said second element, said apparatus comprising:
   (a) shaft means, having one end of the shaft threaded sufficiently along the length of the shaft to permit the shaft means unobstructed insertion into the hole of said second element, for mating with said second element;
   (b) stop means, afixed to the shaft means, for contacting the first element thereby substantially preventing further insertion of the shaft means into the hole of the second element; and
   (c) spring means, having an inside diameter larger than the diameter of the shaft means, coaxially positioned over the shaft means, whereby a first end of the spring means is afixed to the shaft means at a predetermined point of the shaft means, and a second end of the spring means extends to substantially the end of the threaded portion of the shaft means, and when said first element is placed in contact with said second element, for applying a minimum predetermined force between said first and second element when said shaft means is inserted into the hole of said second element to the point where said stop means contacts the surface of said first element.

3. In a data processing system, an apparatus for coupling a voltage from a bus bar to a printed circuit board (PCB) having a bus strip mounted thereon for distributing the voltage to a plurality of circuits mounted on the PCB, said apparatus comprising:
   (a) shaft means, having a first, second, and third diameter along the axis of said shaft means, forming a first, second, and third shaft, respectively, said first diameter being the smallest diameter and said third diameter being the largest diameter, said first shaft being threaded, for mating with said bus bar; and
   (b) spring means, having an inside diameter smaller than the diameter of said third shaft and having a length approximately equal to the length of the first and second shaft, coaxially positioned over said first and second shaft, and when said bus strip is placed in contact with said bus bar, for applying a minimum predetermined force between said bus strip and said bus bar when said first shaft is inserted into the hole of said bus bar to the point where the base of said second shaft contacts the surface of said bus strip.

4. An apparatus according to claim 3, wherein said apparatus further includes:
   (a) a housing means, made of a dielectric material and mounted on said PCB such that the bus strip is essentially encased in said housing means leaving a portion exposed which contacts the bus bar, the housing means further having a receptacle for holding said shaft means and said spring means in an extended condition, said spring means being slightly compressed against the bus strip; and
   (b) extended shaft means, coaxially connected to the third shaft and extending through an opening of the housing means an amount approximately equal to the distance from the base of the second shaft to the surface of the bus strip, for permitting the insertion of the shaft means into the hole of said bus bar, such that when the top surface of the extender shaft means is flush with a surface of the housing means the existence of the minimum predetermined force between the bus strip and the bus bar is visually verifiable.

* * * * *